(12) United States Patent
Ogasawara

(10) Patent No.: US 10,043,634 B2
(45) Date of Patent: Aug. 7, 2018

(54) INSPECTION APPARATUS AND INSPECTION METHOD

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/434,618

(22) Filed: Feb. 16, 2017

(65) Prior Publication Data

US 2017/0243715 A1 Aug. 24, 2017

(30) Foreign Application Priority Data

Feb. 22, 2016 (JP) .................................. 2016-031190

(51) Int. Cl.
| | |
|---|---|
| *H01J 37/20* | (2006.01) |
| *H01J 37/244* | (2006.01) |
| *H01J 37/29* | (2006.01) |
| *H01J 37/26* | (2006.01) |

(52) U.S. Cl.
CPC ............ *H01J 37/244* (2013.01); *H01J 37/20* (2013.01); *H01J 37/263* (2013.01); *H01J 37/29* (2013.01)

(58) Field of Classification Search
CPC ........ G01N 23/04; H01J 37/20; H01J 37/244; H01J 37/26; H01J 37/263; H01J 37/29
See application file for complete search history.

(56) References Cited

U.S. PATENT DOCUMENTS

| | | | |
|---|---|---|---|
| 6,885,000 B1 * | 4/2005 | Adler .................... | G01N 23/22 850/9 |
| 2005/0194535 A1 * | 9/2005 | Noji ....................... | G06T 7/001 250/311 |

(Continued)

FOREIGN PATENT DOCUMENTS

| | | |
|---|---|---|
| JP | 11-16967 | 1/1999 |
| JP | 11-37957 | 2/1999 |

(Continued)

*Primary Examiner* — David E Smith
(74) *Attorney, Agent, or Firm* — Oblon, McClelland, Maier & Neustadt, L.L.P.

(57) ABSTRACT

According to one embodiment, an inspection apparatus includes an irradiation device irradiating an inspection target substrate with multiple beams, a detector detecting each of a plurality of charged particle beams formed by charged particles emitted from the inspection target substrate as an electrical signal, and a comparison processing circuitry performing pattern inspection by comparing image data of a pattern formed on the inspection target substrate, the pattern being reconstructed in accordance with the detected electrical signals, and reference image data. The detector includes a plurality of detection elements that accumulate charges, and a detection circuit that reads out the accumulated charges. The plurality of detection elements are grouped into a plurality of groups. The detection circuit operates in a manner of, during a period in which the charged particle beams are applied to the detection elements included in one group, reading out the charges accumulated in the detection elements included in one or more other groups.

7 Claims, 12 Drawing Sheets

(56) References Cited

U.S. PATENT DOCUMENTS

| | | | |
|---|---|---|---|
| 2009/0114818 A1* | 5/2009 | Casares | H01J 37/045 250/307 |
| 2010/0237252 A1* | 9/2010 | Jin | H01J 37/244 250/370.08 |

FOREIGN PATENT DOCUMENTS

| | | |
|---|---|---|
| JP | 11-83753 | 3/1999 |
| JP | 2003-167061 | 6/2003 |

* cited by examiner t=T t=2T t=3T t=4T t=5T t=6T t=7T t=8T t=9T t=T t=2T t=3T t=4T t=5T t=6T t=7T t=8T t=9T t=T t=2T t=3T t=4T t=5T t=6T t=7T

READING OUT OF CHARGES

INCIDENT REFLECTION ELECTRON BEAMS

READING OUT OF CHARGES

INCIDENT REFLECTION ELECTRON BEAMS

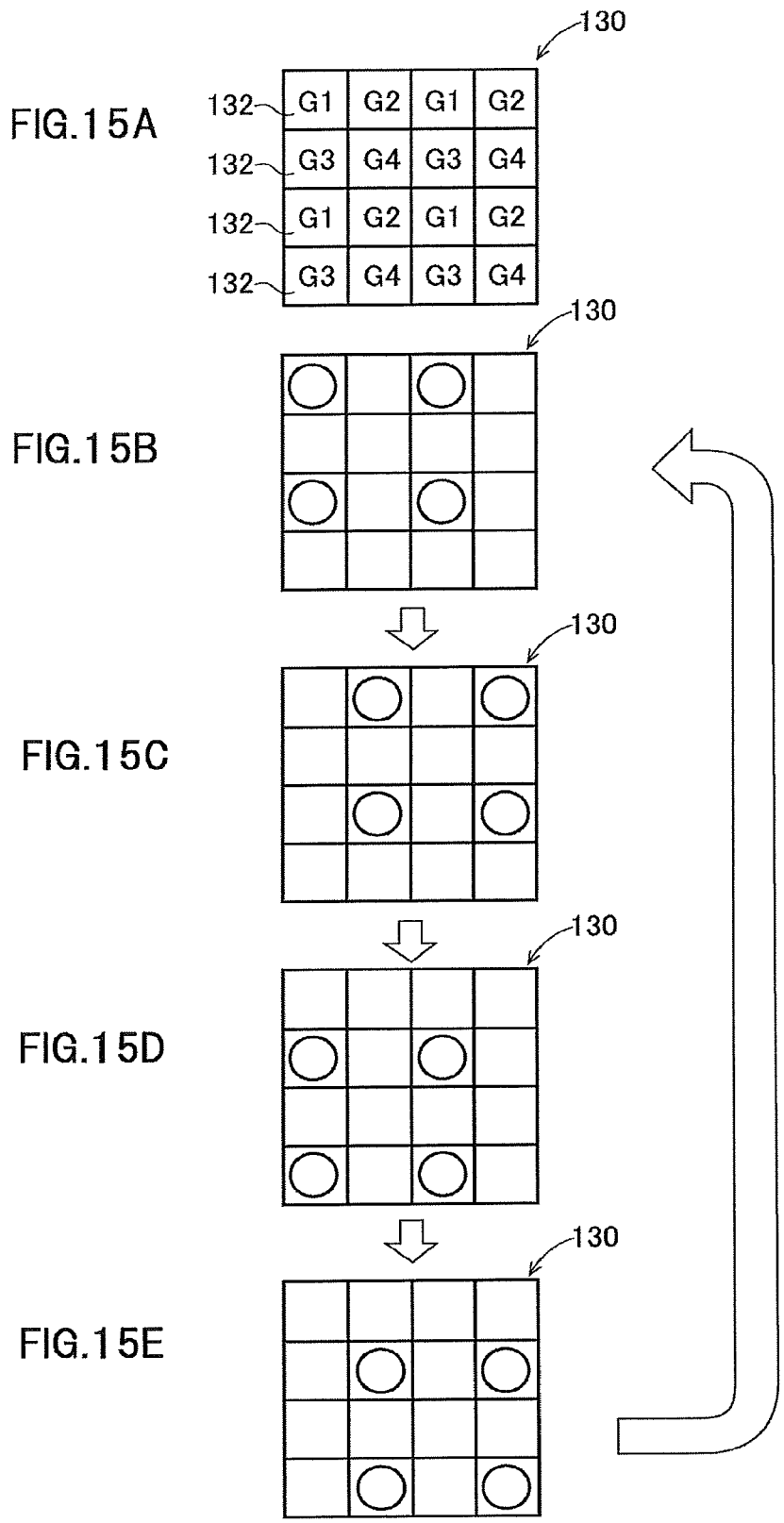

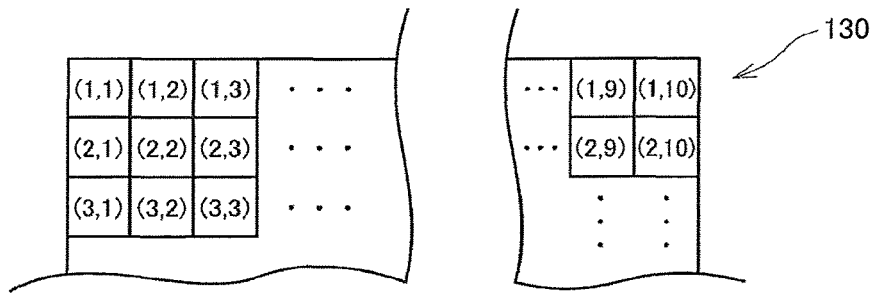
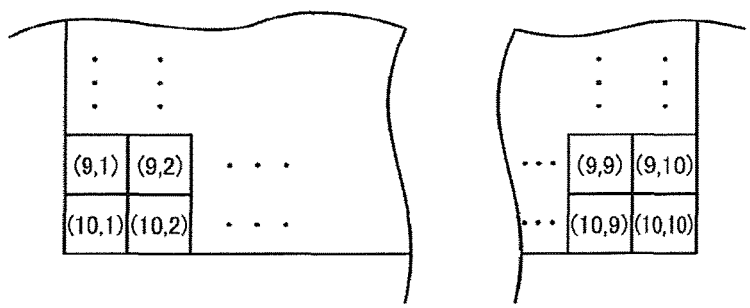
FIG.19
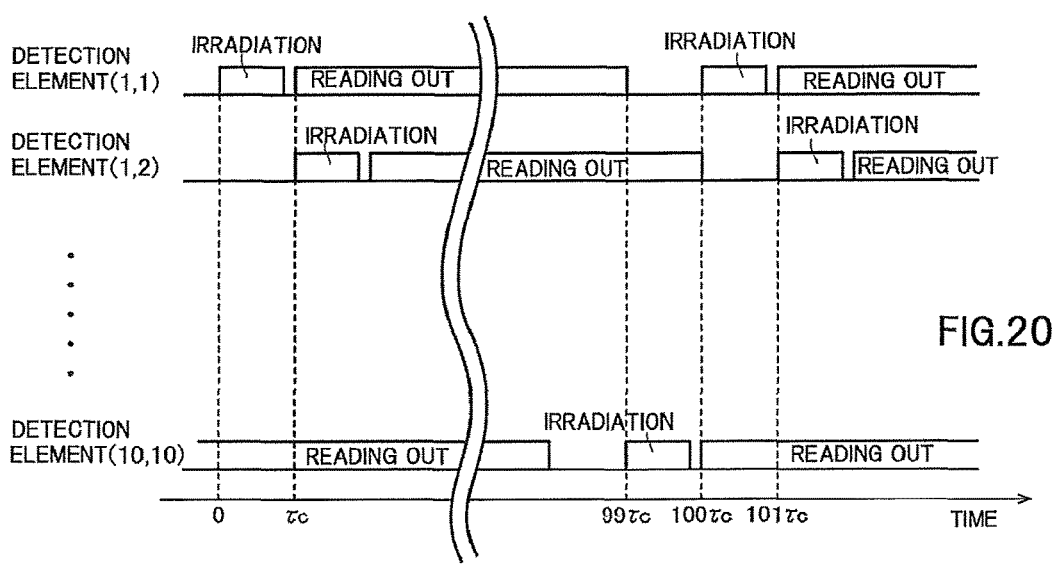
FIG.20

INSPECTION APPARATUS AND INSPECTION METHOD

CROSS REFERENCE TO RELATED APPLICATION

This application is based upon and claims benefit of priority from the Japanese Patent Application No. 2016-031190, filed on Feb. 22, 2016, the entire contents of which are incorporated herein by reference.

FIELD

The present invention relates to an inspection apparatus and an inspection method.

BACKGROUND

As LSI circuits are increasing in density, circuit linewidths of semiconductor devices are becoming finer. In manufacturing a semiconductor device, an exposure mask (also called a reticle, which is used in a stepper or a scanner) having a circuit pattern is used. An exposure apparatus transfers the pattern to a wafer.

Examples of factors that reduce the yield of manufacturing semiconductor devices include a defect of a pattern formed on a mask or a wafer. There is a need to accurately inspect pattern defects. For example, a known apparatus inspects patterns on a sample for defects by irradiating the sample with a plurality of electron beams (multiple beams) and allowing a detector to detect reflected electrons or secondary electrons released from the sample. The use of multiple beams provides higher throughput of defect inspection than an inspection apparatus using a single electron beam (single beam).

A detector accumulates charges attributable to reflection electrons or secondary electrons that are received by the same, and takes out those charges as an electrical signal. Because an amount of the accumulated charges attributable to the reflection electrons or the secondary electrons is small, the accumulated charges are preferably read out with a low-speed and high-sensitivity detection circuit in order to increase inspection accuracy. However, the reflection electrons or the secondary electrons cannot be received and detected during reading of the charges. Thus, there has been a problem that the reading of the charges with the low-speed and high-sensitivity detection circuit reduces the throughput of inspection.

BRIEF DESCRIPTION OF THE DRAWINGS

FIG. 15A illustrates an example of grouping of the detection elements, and FIGS. 15B to 15E illustrate an example of switching-over between the detection elements accumulating charges and the detection elements from which charges are read out.

FIG. 19 is a plan view illustrating one example of a detector.

FIG. 20 is a timing chart referenced to explain accumulation and reading-out of charges by individual detection elements.

DETAILED DESCRIPTION

According to one embodiment, an inspection apparatus includes an irradiation device irradiating an inspection target substrate with multiple beams including a plurality of energy beams, a detector to which a plurality of charged particle beams formed by charged particles emitted from the inspection target substrate are applied, the detector detecting each of the charged particle beams as an electrical signal, and a comparison processing circuitry performing pattern inspection by comparing image data of a pattern formed on the inspection target substrate, the pattern being reconstructed in accordance with the detected electrical signals, and reference image data. The detector includes a plurality of detection elements that accumulate charges attributable to the charged particle beams applied thereto, and a detection circuit that reads out the accumulated charges, the plurality of detection elements being grouped into a plurality of groups, and the detection circuit operates in a manner of, during a period in which the charged particle beams are applied to the detection elements included in one group, reading out the charges accumulated in the detection elements included in one or more other groups.

Embodiments of the present invention will be described below with reference to the drawings.

Figure 1:
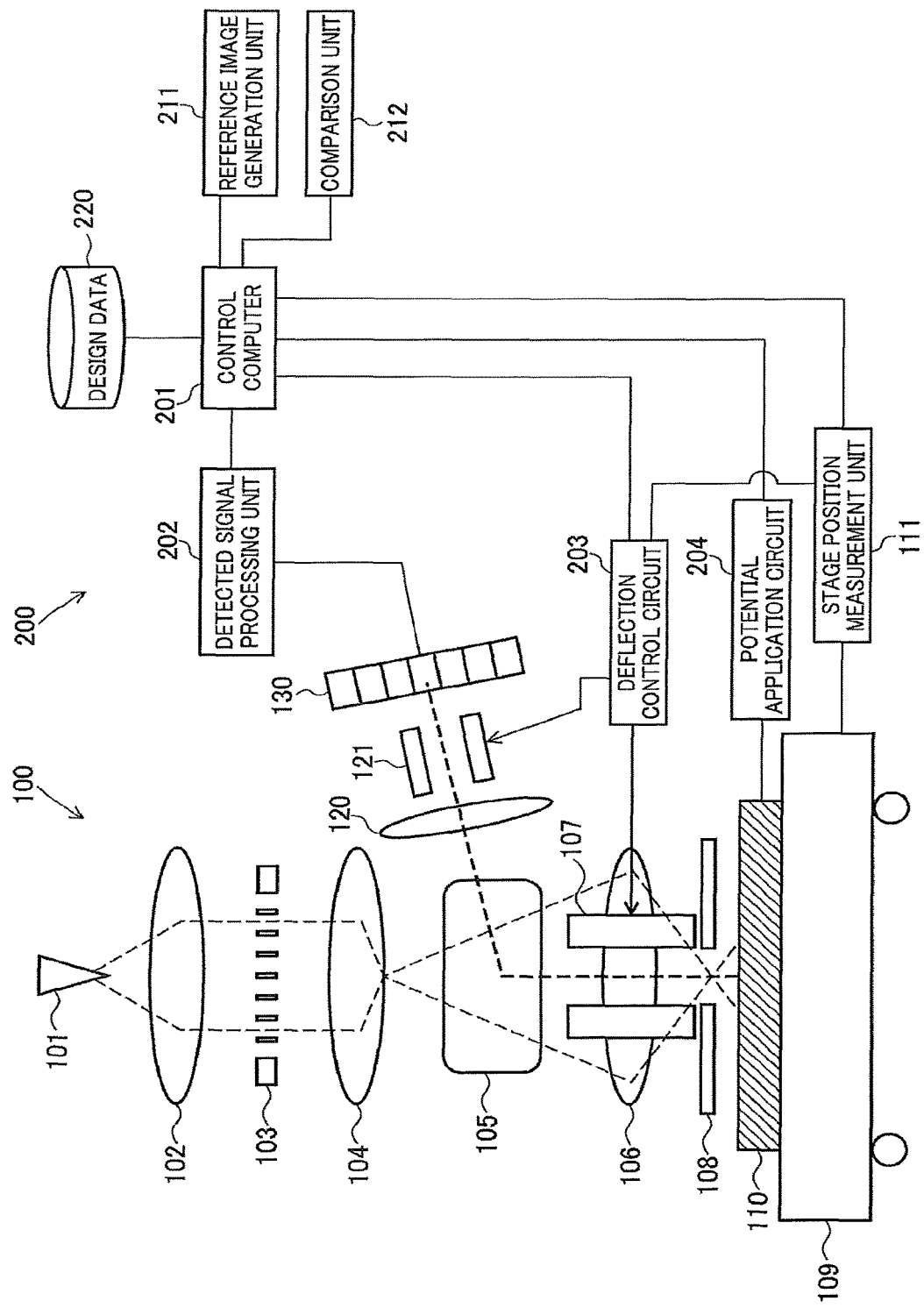
FIG. 1 is a schematic diagram of the configuration of an inspection apparatus according to an embodiment of the present invention.

FIG. 1 is a schematic view illustrating a configuration of an inspection apparatus according to an embodiment of the present invention. As illustrated in FIG. 1, the inspection apparatus includes an image capturing unit 100 for capturing image data of a substrate 110 that is an inspection target, and an arithmetic and control unit 200 for performing not only control of the entire inspection apparatus, but also an inspection process for the substrate 110 by employing the image data that has been captured by the image capturing unit 100.

The image capturing unit 100 includes an electron source 101, an illumination lens 102, an aperture mask 103, a lens 104, a Wien filter 105, an object lens 106, a deflector 107, an acceleration electrode 108, a stage 109, a stage position measurement unit 111, a lens 120, a deflector 121, and a detector 130. The substrate 110, i.e., a sample to be inspected, is placed on the stage 109. The substrate 110 is, for example, an exposure mask used in manufacturing a semiconductor device.

Figure 2:
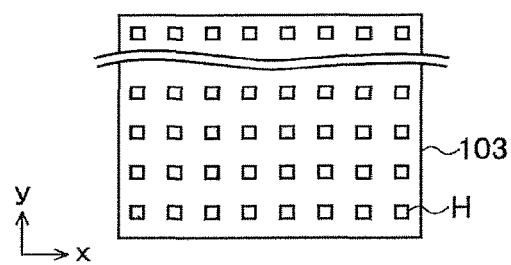
FIG. 2 is a schematic diagram of the configuration of an aperture mask.

FIG. 2 is a conceptual view illustrating a configuration of the aperture mask 103. As illustrated in FIG. 2, the aperture mask 103 has a plurality of holes (openings) H arrayed in a vertical direction (y-direction) and a horizontal direction (x-direction). The individual holes H are rectangular or circular holes having the same size and shape, for example. While FIG. 2 illustrates an example in which the holes H are arrayed in a grid pattern, they may be arrayed in a zigzag pattern.

An electron beam emitted vertically downward from the electron source 101 substantially perpendicularly illuminates the aperture mask 103 after passing through the illumination lens 102. The electron beam illuminates a region of the aperture mask 103, the region covering all of the plurality of holes H. Multiple beams are generated with the electron beam passing through the plurality of holes H.

Here, the aperture mask 103 may be disposed in the form of a blanking aperture array including a deflection electrode upstream, downstream, or the inside of each hole H to control deflection of the electron beam passing through each hole H, and an aperture which blocks the deflected electron may be provided downstream side of the aperture mask 103, in order that currents of the electron beams reaching a sample surface can be individually controlled. The currents of the electron beams reaching the sample surface may also be individually controlled by separately disposing a blanking aperture array including a deflection electrode for each aperture, and by controlling the deflection of the electron beam.

The Wien filter 105 applies an electric field and a magnetic field in an orthogonal relation with respect to the vertical direction. Electrons entering the Wien filter 105 from above travel straight forward because forces caused by the electric field and the magnetic field act on the electrons in directions cancelling each other. Therefore, the multiple beams having been condensed by the lens 104 enters the Wien filter 105 from above and pass through the Wien filter 105 downward while traveling straight forward.

The multiple beams having passed through the Wien filter 105 are focused by the object lens 106, are deflected by a deflector 107, and are applied to the substrate 110. Thus, the electron source 101, the illumination lens 102, the aperture mask 103, the lens 104, the Wien filter 105, the object lens 106, and the deflector 107 constitute an irradiation unit for irradiating the substrate 110 with the multiple beams.

Reflection electrons having been reflected from the substrate 110 are collected by the object lens 106, and they enter the Wien filter 105 from below. The reflection electrons having entered the Wien filter 105 from below are bent in a direction toward a region where the detector 130 is arranged, because the forces caused by the electric field and the magnetic field act on the reflection electrons in the same direction. Thus, the Wien filter 105 can separate the electrons applied to the substrate 110 and the electron reflected from the substrate 110.

The reflection electrons having been bent in traveling direction by the Wien filter 105 are focused on the detector 130 by the lens 120. The deflector 121 deflects the reflection electrons to be able to adjust focused positions of the reflection electrons on the detector 130.

Although the following embodiment is described on an assumption of employing the reflection electrons as the electrons emitted from the substrate 110, secondary electrons may be used instead of the reflection electrons. In such a case, the secondary electrons can be accelerated by applying a negative bias to the substrate 110 with a potential application circuit 204, and by biasing the acceleration electrode 108 to a ground potential.

Figure 3A:
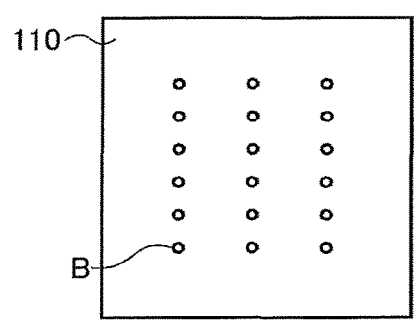
FIG. 3A illustrates beam irradiation positions on a substrate and FIG. 3B is a diagram illustrating detecting elements included in a detector.
Figure 3B:
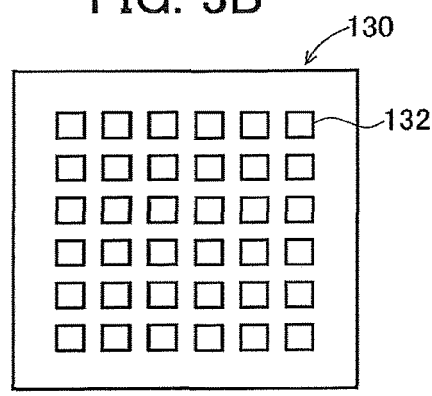

The multiple beams are applied to the substrate 110, and multiple beams of reflection electrons are focused on the detector 130. The detector 130 includes a plurality of detection elements that detect the reflection electrons. FIG. 3A illustrates an example of beams B applied to the substrate 110, and FIG. 3B illustrates an example of detection elements 132 disposed in the detector 130 in a two-dimensional array. The detector 130 includes multi-channel detection elements. For example, a combination of a scintillator and a CCD can be used as the detector 130. When the electron beams are applied to the detection elements 132, charges are accumulated in the detection elements 132, and the electron beams can be detected as electrical signals by a detection circuit (not illustrated) reading out amounts of the accumulated charges. Values detected the individual detection elements 132 are obtained as image data of a pattern image focused on the detector 130.

Here, the charges accumulated in the detection element 132 are not limited to charges of each electron beam itself, and they need just to be charges attributable to each electron beam. For example, the accumulated charges may be charges obtained after multiplying each electron beam through a current multiplier, or obtained by temporarily converting each electron beam to an optical signal, then generating photoelectrons with the optical signal, and further multiplying the photoelectrons by a photomultiplier.

The detection elements 132 of the detector 130 are disposed at conjugate positions with respect to a pattern surface of the substrate 110.

In this embodiment, the detector 130 includes the detection elements 132 in number twice as many as the multiple beams applied to the substrate 110 (i.e., the number of the multiple beams of the reflection electrons focused on the detector 130). A method of detecting the reflection electrons by the detector 130 will be described later.

Figure 4:
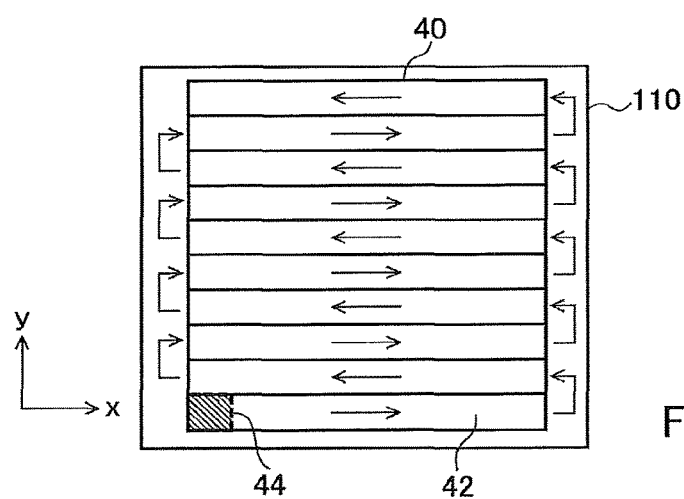
FIG. 4 is a diagram explaining an exemplary inspection operation.

A distance by which the multiple beams are deflected by the deflector 107 is smaller than an inspection region of the substrate 110, and the multiple beams are applied while the stage 109 is moved, in order to inspect the entirety of the inspection region. FIG. 4 is a conceptual view referenced to explain one example of an inspection operation. As illustrated in FIG. 4, an inspection region 40 of the substrate 110 is virtually divided, for example, in the y-direction into a plurality of striped regions 42 each being in the form of a strip with a predetermined width. First, the stage 109 is moved and is adjusted such that an irradiation region 44 capable of being irradiated with one irradiation shot of the multiple beams is located at a left end of the first striped region 42 or at a position more left than the left end. The irradiation is then started.

In inspecting the first striped region 42, the stage 109 is moved in the −x-direction, for example, whereby the beams are scanned relatively in the x-direction. The stage 109 is moved continuously at a predetermined speed. After the end of the irradiation to the first striped region 42, the stage position is moved in the −y-direction and is adjusted such that the irradiation region 44 is shifted relatively in the y-direction to be located at a right end of the second striped region 42 or at a position more right than the right end. The stage 109 is now moved in the x-direction, whereby the irradiation is performed in the −x-direction in a similar manner. Thereafter, in the third striped region 42, the irradiation is performed in the x-direction, and in the fourth striped region 42, the irradiation is performed in the −x-direction. Thus, an inspection time can be cut by repeating the irradiation of the multiple beams while alternately changing the beam scanning direction, as described above.

Without being limited to the above case of performing the irradiation while alternately changing the beam scanning direction, the irradiation may be progressed in the same direction in inspecting the individual striped regions 42. A plurality of beam patterns in the same number as that of the holes H are applied once for the irradiation with the multiple beams formed after passing through the individual holes H of the aperture mask 103.

Figure 5A:
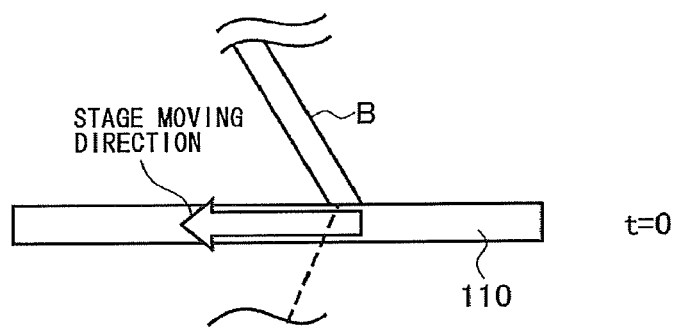
FIGS. 5A to 5C are diagrams illustrating an electron beam following the movement of a stage.
Figure 5B:
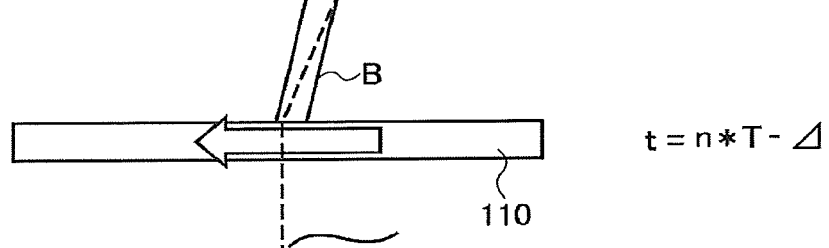
Figure 5C:
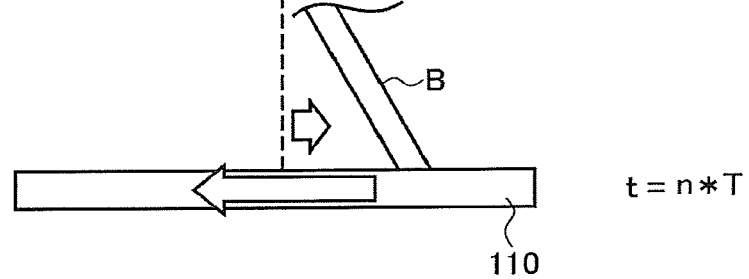

As illustrated in FIGS. 5A and 5B, the deflector 107 deflects an electron beam B following the movement of the stage 109 in such a manner that the electron beam B is applied to the same position of the substrate 110 for a predetermined time n*T (n is a natural number) with T representing a unit time. This is called "tracking deflection". In addition to the tracking deflection, a small deflection for applying the electron beam B to a plurality of positions on the sample surface is performed m times (m: 0 or a natural number), as illustrated in FIGS. 6 to 11. After the lapse of the predetermined time n*T, as illustrated in FIG. 5C, the deflector 107 shifts the beam irradiation position on the substrate 110 in a way including, for example, a step of returning the electron beam B to an original position.

The movement position of the stage 109 is measured by the stage position measurement unit 111. For example, a laser length-measuring system is used as the stage position measurement unit 111.

Figure 6A:
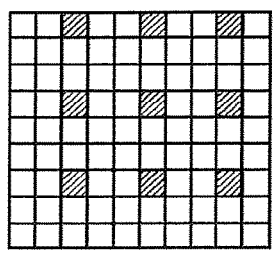
FIGS. 6A to 6E are diagrams explaining an exemplary way of scanning multiple beams.
Figure 6B:
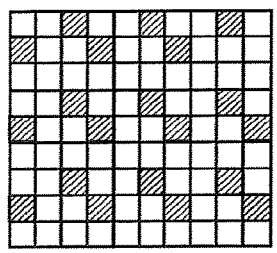
Figure 6C:
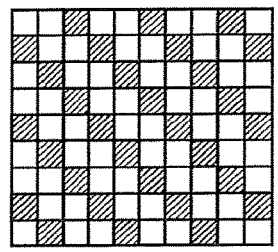
Figure 6D:
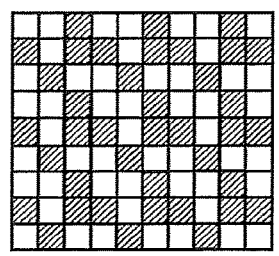
Figure 6E:
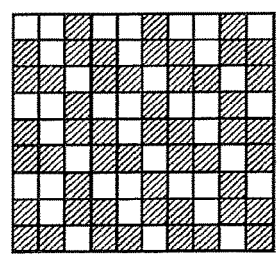
Figure 7F:
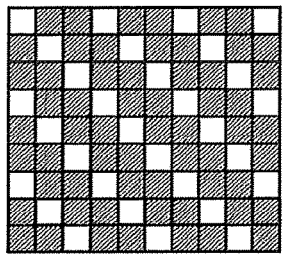
FIGS. 7F to 7I are diagrams explaining the exemplary way of scanning the multiple beams.
Figure 7G:
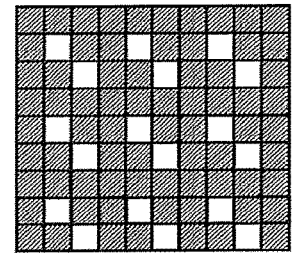
Figure 7H:
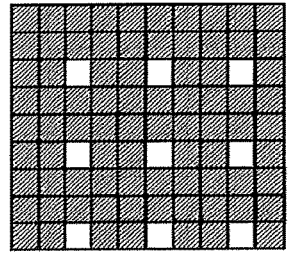
Figure 7I:
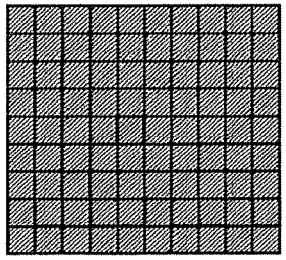

FIGS. 6A to 6E and FIGS. 7F to 7I are conceptual views referenced to explain an example of a multi-beam scanning method. FIG. 6A illustrates regions (pixels) to be first irradiated. Subsequently, as illustrated in FIGS. 6B to 6E and FIGS. 7F to 7I, the beam irradiation is performed while each beam position is successively shifted in the x-direction and/or the y-direction to pixels that are not yet irradiated.

Figure 8A:
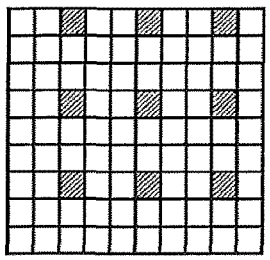
FIGS. 8A to 8E are diagrams explaining another exemplary way of scanning multiple beams.
Figure 8B:
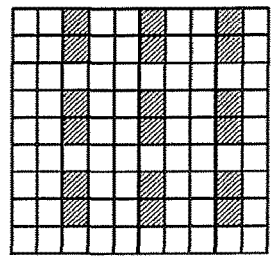
Figure 8C:
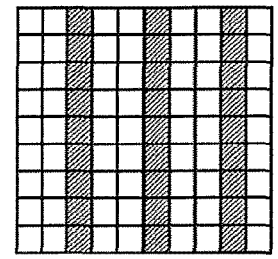
Figure 8D:
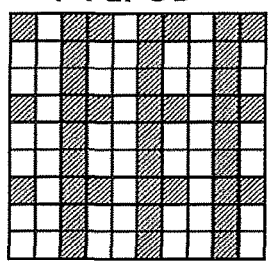
Figure 8E:
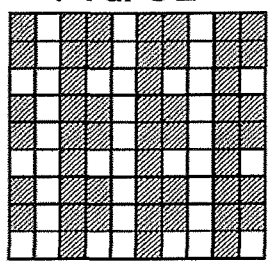
Figure 9F:
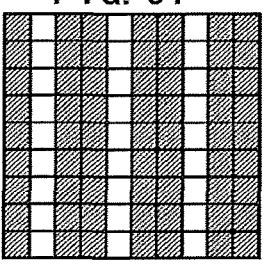
FIGS. 9F to 9I are diagrams explaining the exemplary way of scanning the multiple beams.
Figure 9G:
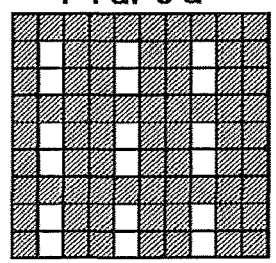
Figure 9H:
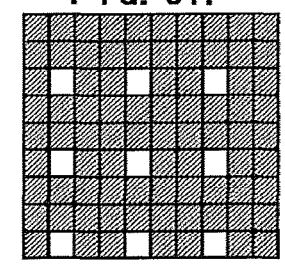
Figure 9I:
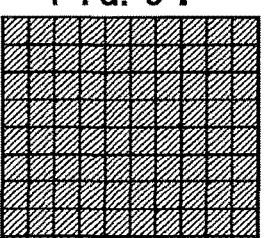

FIGS. 8A to 8E and FIGS. 9F to 9I are conceptual views referenced to explain another example of the multi-beam scanning method. FIG. 8A illustrates regions (pixels) to be first irradiated. Then, as illustrated in FIGS. 8B and 8C, the second and third irradiations are successively performed while each beam position is shifted in the y-direction to not-yet-irradiated pixels one by one. Then, as illustrated in FIG. 8D, the fourth irradiation is performed after shifting each beam position by one pixel in the x-direction to a not-yet-irradiated pixel. Then, as illustrated in FIGS. 8E and 9F, the fifth and sixth irradiations are successively performed while each beam position is shifted in the y-direction to not-yet-irradiated pixels one by one. Subsequently, as illustrated in FIGS. 9G to 9I, the beam irradiation is performed while each beam position is successively shifted in the x-direction or the y-direction to not-yet-irradiated pixels.

Figure 10A:
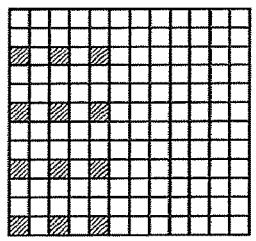
FIGS. 10A to 10D are diagrams explaining still another exemplary way of scanning multiple beams.
Figure 10B:
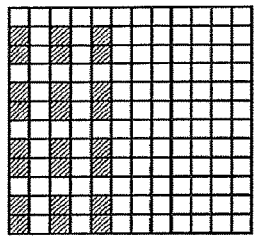
Figure 10C:
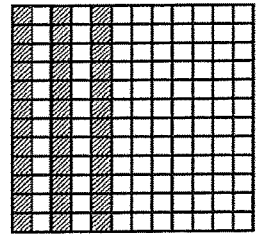
Figure 10D:
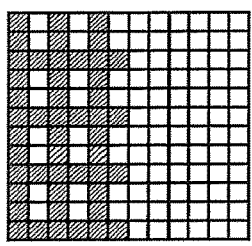
Figure 11E:
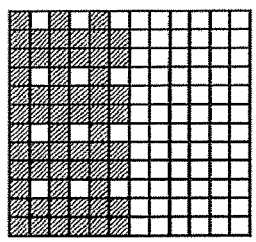
FIGS. 11E to 11G are diagrams explaining the exemplary way of scanning the multiple beams.
Figure 11F:
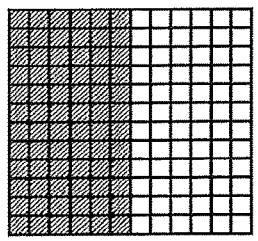
Figure 11G:
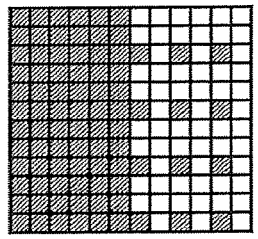

FIGS. 10A to 10D and FIGS. 11E to 11G are conceptual views referenced to explain still another example of the multi-beam scanning method. In this example, the inspection is carried out using multiple beams of 3×4 in the x- and y-directions. FIG. 10A illustrates regions (pixels) to be first irradiated. Then, as illustrated in FIGS. 10B and 10C, the second and third irradiations are successively performed while each beam position is shifted in the y-direction to not-yet-irradiated pixels one by one. Then, as illustrated in FIG. 10D, the fourth irradiation is performed after shifting the beam position by one pixel in the x-direction to a not-yet-irradiated pixel. Then, as illustrated in FIGS. 11E and 11F, the fifth and sixth irradiations are successively performed while each beam position is shifted in the y-direction to not-yet-irradiated pixels one by one. Then, as illustrated in FIG. 11G, the entirety of the multiple beams is shifted in the x-direction through a size of the irradiation region, and the beam irradiation is performed in a similar manner.

Thus, the multiple beams are scanned over the inspection region of the substrate 110 in accordance with any of the above-described methods, and a pattern image of the substrate 110, formed by the reflection electrons, is focused on the detector 130. The pattern image (i.e., the reflection electrons) is detected by the detector 130. Signal amounts of the reflection electrons (i.e., pixel data of the image) are detected, for example, by converting the reflection electrons to lights, accumulating charges generated with irradiation of those lights, and by taking out the charges as electrical signals.

As illustrated in FIG. 1, the arithmetic and control unit 200 includes a control computer 201, a detected signal processing unit 202, a deflection control circuit 203, a potential application circuit 204, a reference image generation unit 211, a comparison unit 212, and a storage device 220 such as a magnetic disk. The storage device 220 (storage unit) stores design data of the substrate 110.

The detected signal processing unit 202 obtains the pixel data of the pattern image (also simply called an image) from the detector 130, and transfers the pixel data to the control computer 201. By employing the pixel data, the control computer 201 reconstructs the image data of the pattern formed on the substrate 110.

The deflection control circuit 203 controls the distance of the beam deflection made by the deflector 107 such that the multiple beams are each applied to the desired position on the substrate 110. Furthermore, the deflection control circuit 203 controls the distance of the beam deflection made by the deflector 121 such that the reflection electron beams are each focused at the desired position on the detector 130. The deflection control circuit 203 adjusts the distance of the beam deflection made by the deflector 121 such that the reflection electron beams, which are generated with the beams following the movement of the substrate 110, are each focused on the same detection element 132.

The potential application circuit 204 applies a potential to the substrate 110 when the secondary electrons are to be accelerated.

The reference image generation unit 211 converts the design data stored in the storage device 220 to image data, and generates reference image data. The reference image data is, for example, 8-bit data for each pixel without any sign, and it represents a gradation level of brightness (light amount) for each pixel.

The comparison unit 212 compares the image data, which has been reconstructed by the detected signal processing unit 202 on the basis of the pixel data obtained from the detector 130, and the reference image data generated by the reference image generation unit 211 after aligning positions of both the image data with each other. As a result of the comparison, a defect of the pattern formed on the substrate 110 can be detected.

In this embodiment, the amount of the accumulated charges is read out by employing a low-speed and high-sensitivity detection circuit in the detector 130 with intent to detect the signal amounts of the reflection electrons at high accuracy. Moreover, in order to avoid reduction of the throughput of inspection, the plurality of detection elements 132 disposed in the detector 130 are grouped into two groups and are operated such that, during a period in which the charges attributable to the reflection electrons are accumulated by the detection elements 132 of one group, the amounts of the accumulated charges are read out from the detection elements 132 of the other group.

Figure 12A:
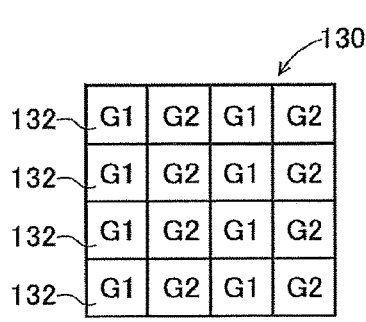
FIG. 12A illustrates an example of grouping of detection elements.
Figure 12B:
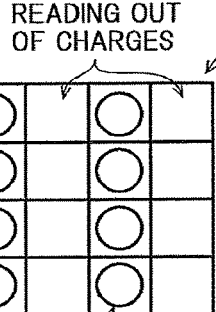
FIGS. 12B and 12C illustrate an example of switching-over between detection elements accumulating charges and detection elements from which charges are read out.

As illustrated in FIG. 12A, by way of example, the plurality of detection elements 132 in the detector 130 are grouped into a group G1 and a group G2. In the example of FIG. 12A, the detection elements 132 arrayed side by side in the y-direction are set to belong to one group, and the group G1 and the group G2 are arranged alternately in the x-direction. As illustrated in FIG. 12B, during a period in which the reflection electron beams are incident on the detection elements 132 of the group G1 and charges are accumulated in those detection elements 132, charges accumulated in the detection elements 132 of the group G2 are read out. The charges accumulated in the detection elements 132 of the group G2 are reset after the reading-out of the charges from those detection elements 132.

Figure 12C:
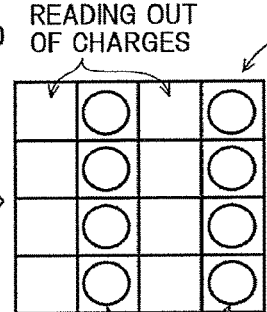

Then, as illustrated in FIG. 12C, during a period in which the reflection electron beams are incident on the detection elements 132 of the group G2 and charges are accumulated in those detection elements 132, charges accumulated in the detection elements 132 of the group G1 are read out. The charges accumulated in the detection elements 132 of the group G1 are reset after the reading-out of the charges from those detection elements 132.

Figure 13:
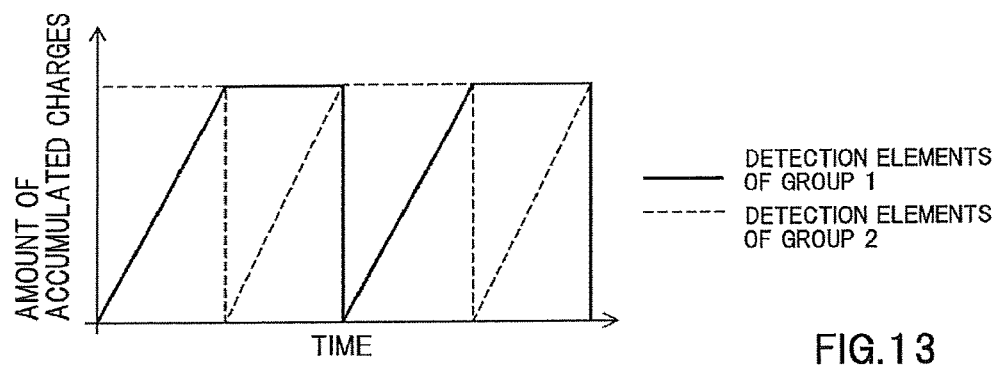
FIG. 13 is a graph depicting an example of change in amounts of the accumulated charges.

FIG. 13 depicts an example of change in amounts of the charges accumulated in the detection elements 132 of the group G1 and the detection elements 132 of the group G2. Thus, in this embodiment, the detection elements 132 accumulating the charges and the detection elements 132 from which the charges are read out are switched over successively. Each of the detection elements 132 repeats operations of accumulating, reading out, and resetting the charging.

The deflection control circuit 203 controls the distance of the beam deflection made by the deflector 121 such that the focused positions (irradiation positions) of the reflection electron beams are switched over to be aligned alternately with the detection elements 132 of the group G1 and the detection elements 132 of the group G2. After performing the beam irradiation to the same pixels on the substrate 110 for a predetermined time, the focused positions of the reflection electron beams are switched over corresponding to change of the irradiation target pixels. During a period in which the deflector 107 shifts the irradiation position of the electron beam B on the substrate 110 (see FIG. 5C), the charges accumulated in the detection elements 132 from which the charges have been read out may be reset.

According to this embodiment, as described above, the plurality of detection elements 132 are grouped into two groups, and during the period in which the charges attributable to the reflection electrons are accumulated by the detection elements 132 of one group, the amounts of the accumulated charges are read out from the detection elements 132 of the other group. Since the low-speed and high-sensitivity detection circuit is used to read out the charges, the charges can be read out at high accuracy even with the amount of the accumulated charges being small. Moreover, reduction of the throughput of inspection can be avoided because, during the reading-out of the charges, the charges attributable to the reflection electrons are accumulated in the detection elements of the other group.

Figure 14A:
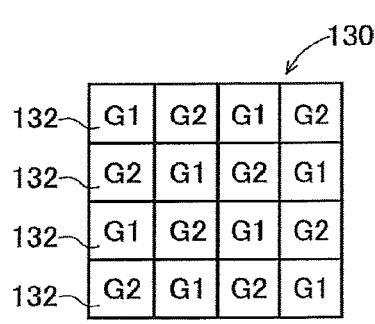
FIG. 14A illustrates an example of grouping of the detection elements.
Figure 14B:
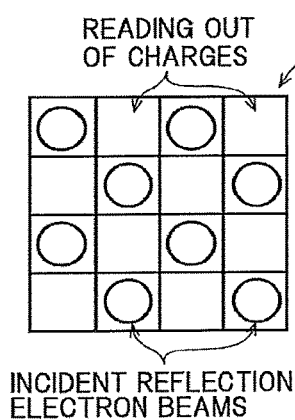
FIGS. 14B and 14C illustrate an example of switching-over between the detection elements accumulating charges and the detection elements from which charges are read out.
Figure 14C:
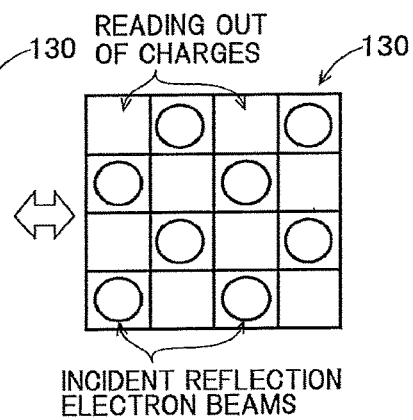

When the plurality of holes H are arranged in the aperture mask 103 in the zigzag pattern, the plurality of detection elements 132 are grouped into groups G1 and G2, as illustrated in FIG. 14A. In the example of FIG. 14A, the detection elements 132 of the group G1 and the detection elements 132 of the group G2 are arrayed alternatively in each of the x- and y-directions. As illustrated in FIG. 14B, during a period in which the reflection electron beams are incident on the detection elements 132 of the group G1 and charges are accumulated in those detection elements 132, charges accumulated in the detection elements 132 of the group G2 are read out. Furthermore, as illustrated in FIG. 14C, during a period in which the reflection electron beams are incident on the detection elements 132 of the group G2 and charges are accumulated in those detection elements 132, charges accumulated in the detection elements 132 of the group G1 are read out. For this purpose, a multichannel deflector which controls electron beams corresponding to the group G1 and electron beams corresponding to the group G2 independently may be used as the deflector 121. Also, one detection element array may be added and the deflector 121 may deflect the reflection electrons collectively.

Although the above embodiment has been described in connection with an example in which the detector 130 includes the detection elements 132 in number twice as many as the multiple beams applied to the substrate 110 and in which the detection elements 132 are grouped into two groups, the detection elements may be grouped into three or more groups. Assuming that the number of the multiple beams is denoted by A and the number of the groups is denoted by B, the detector 130 preferably includes the detection elements 132 in number of A×B or more.

FIG. 15A illustrates an example in which the detection elements 132 are grouped into four groups G1 to G4. The detection elements 132 in which charges are accumulated with irradiation of the reflection electron beam are switched over successively as illustrated in FIGS. 15B to 15E. Because a time during which the reflection electron beam is applied successively to the detection elements 132 of the other three groups can be allocated to read out the charges, the accumulated charges can be read out by the low-speed and high-sensitivity detection circuit at higher accuracy.

Figure 16:
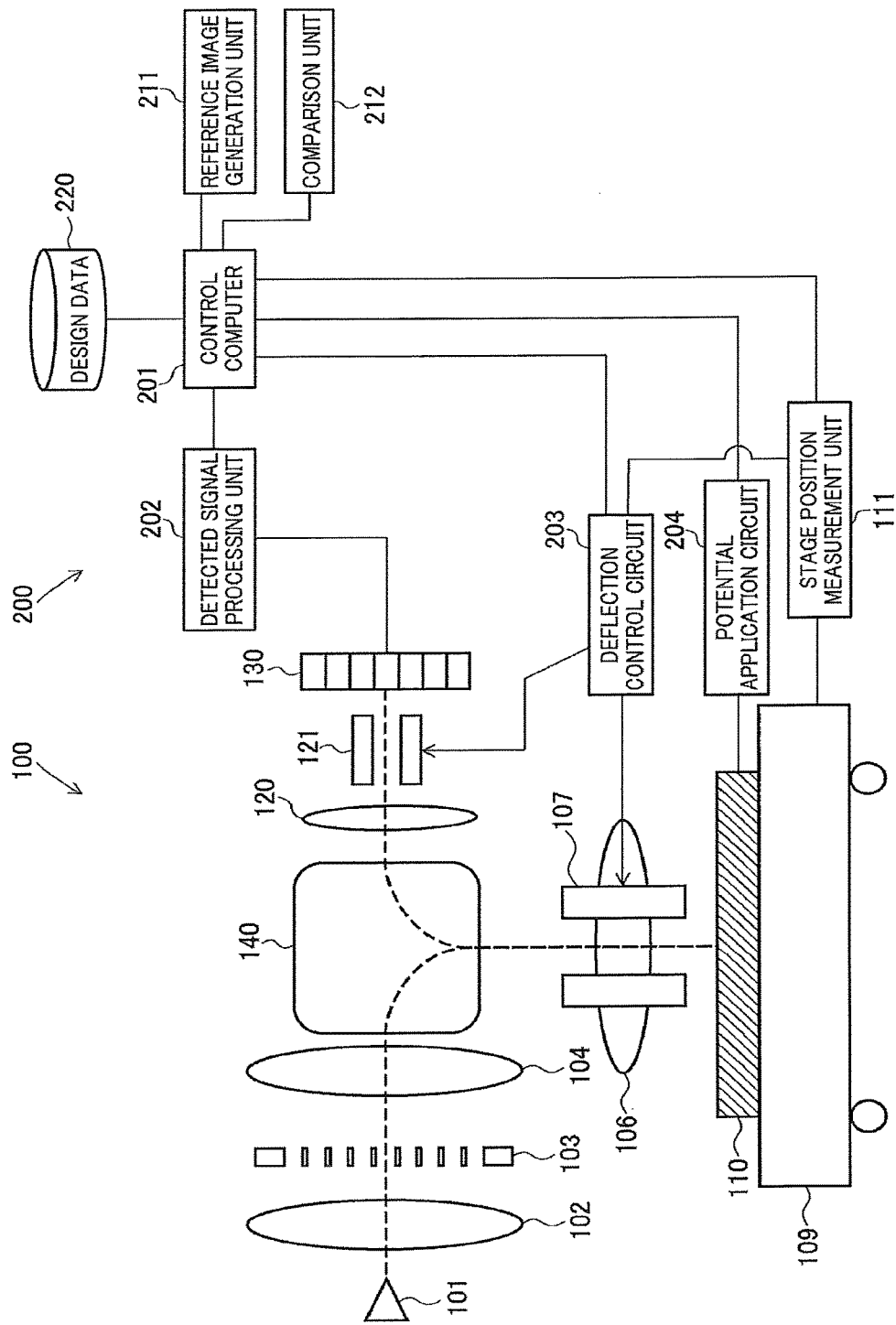
FIG. 16 is a schematic diagram illustrating an inspection apparatus according to a modification.

In the above-described embodiment, the Wien filter 105 is used to separate electrons to be applied to the substrate 110 from electrons reflected by the substrate 110. As illustrated in FIG. 16, an electromagnetic prism 140 may be used instead of the Wien filter 105. In FIG. 16, the same components as those in FIG. 1 are designated by the same reference numerals and a description of these components is omitted.

The Wien filter 105 in FIG. 1 allows electrons that enter the filter from above to travel straight and bends the path of electrons that enter the filter from below. The electromagnetic prism 140 in FIG. 16 bends the path of electrons that enter the prism, irrespective of the direction of incidence. The electromagnetic prism 140 directs the path of the multiple beams reduced by the lens 104 toward the substrate 110. In addition, the electromagnetic prism 140 directs the path of reflected electrons emanating from the substrate 110 toward the detector 130.

Figure 17:
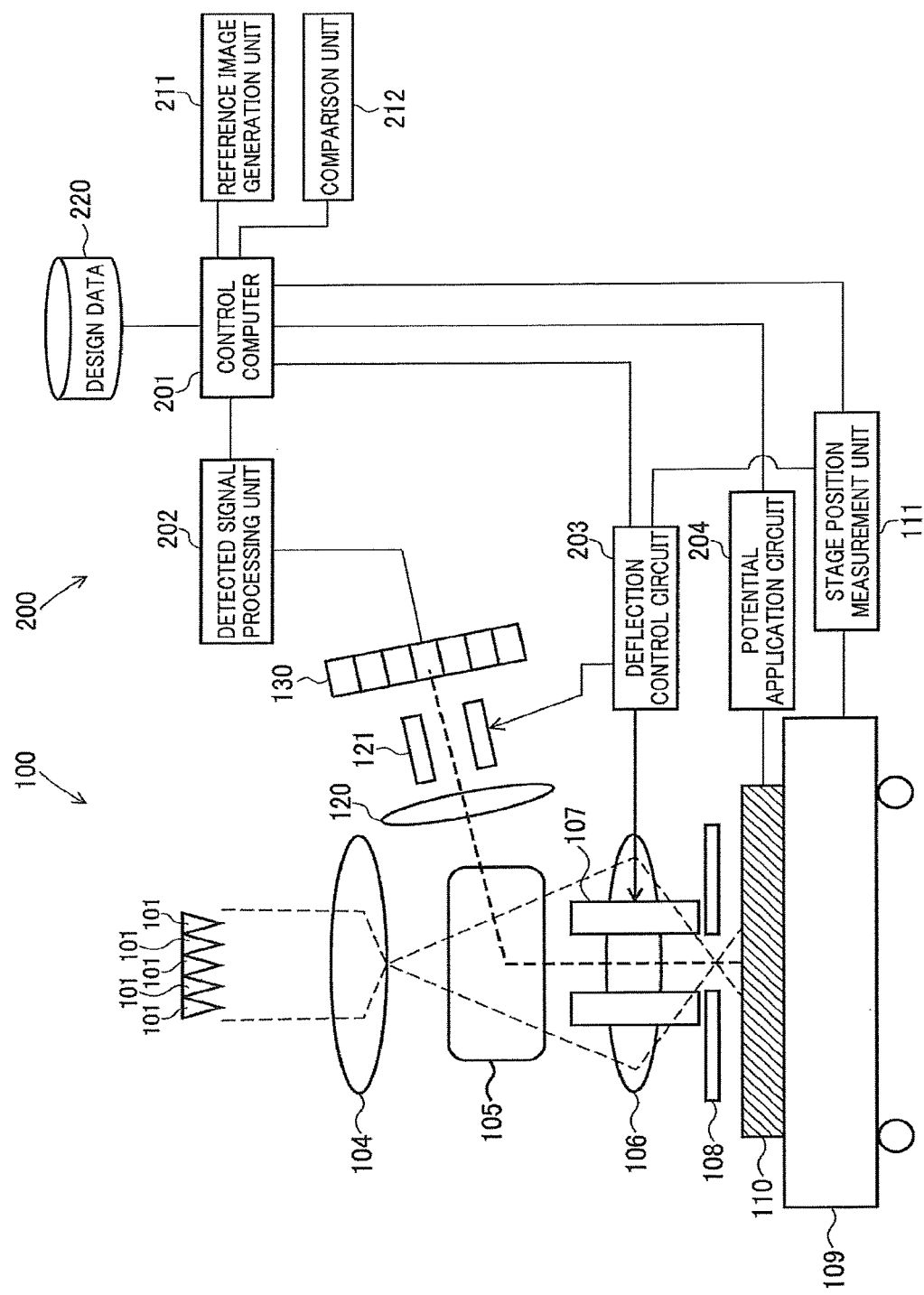
FIG. 17 is a schematic diagram illustrating an inspection apparatus according to another modification.

In the above-described embodiment, the electron beam (single beam) emitted from the electron source 101 is allowed to pass through the holes H of the aperture mask 103, thus forming the multiple beams. As illustrated in FIG. 17, a plurality of electron sources 101 may be arranged. Each of the electron sources 101 may emit an electron beam (single beam) to form multiple beams. In this case, the electron sources 101 can be individually controlled such that the on/off state of the electron beam emitted from each electron source 101 is controlled.

In the above-described embodiment, the two-dimensional array of multiple beams and the two-dimensional array of detecting elements 132 have been described as an example. A one-dimensional array of multiple beams and a one-dimensional array of detecting elements 132 may be used.

In the above-described embodiment, the reference image data based on the design data of the substrate to be inspected is used. The reference image data is not limited to this example. For example, image data obtained by inspecting identical patterns formed at different positions on a single substrate or formed on different substrates may be used as reference image data.

In the above-described embodiment, the configuration for applying electron beams to the substrate 110 has been described. Another energy beams, such as ion beams, neutral particle beams, X-ray, or laser beams, may be applied. In applying ion beams, the detector 130 may detect ion beams of ions released from the substrate 110 instead of electron beams of electrons released from the substrate 110.

At least part of the arithmetic and control unit 200 described in the above embodiments may be implemented in either hardware or software. When implemented in software, a program that realizes at least part of functions of the arithmetic and control unit 200 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

Although the above embodiment has been described in connection with the inspection apparatus of irradiating the sample with the plurality of charged particle beams, the inspection apparatus may be of the type irradiating the sample with the single charged particle beam. In such a case, measurement points can be switched over in a shorter time by, corresponding to reduction in the number of the beams, increasing the current density of one beam and shortening a beam irradiation time for each measurement point. In the inspection apparatus of related art, during reading-out of charges for one measurement point, accumulation of charges for the next measurement point cannot be performed, and hence the throughput of inspection is reduced. A high-speed and high-sensitivity detection circuit needs to be used in order to avoid reduction of the throughput of inspection. However, such a solution is difficult to realize from the technical point of view.

In contrast, according to the embodiment described above, since the detector including the plurality of detection elements is used and the detection elements in which charges are accumulated are switched over corresponding to change of the measurement point on the sample, the charges can be accumulated in the detection elements in a shorter time, and the low-speed and high-sensitivity detection circuit can be used to read out the accumulated charges. As a result, high-speed and high-sensitivity measurement can be realized.

When scanning of the electron beam is performed while continuously changing the scanned position in a mode other than vector scan, a time step is determined as appropriate, and a region irradiated with the charged particles during the determined time step is defined as the irradiation region of the electron beam. In that case, there is a time taken for the secondary electrons to traverse between the detection elements. From the viewpoint of improving resolution, it is effective to dispose a blanking mechanism upstream of the detector to block off the secondary electrons as appropriate.

Figure 18:
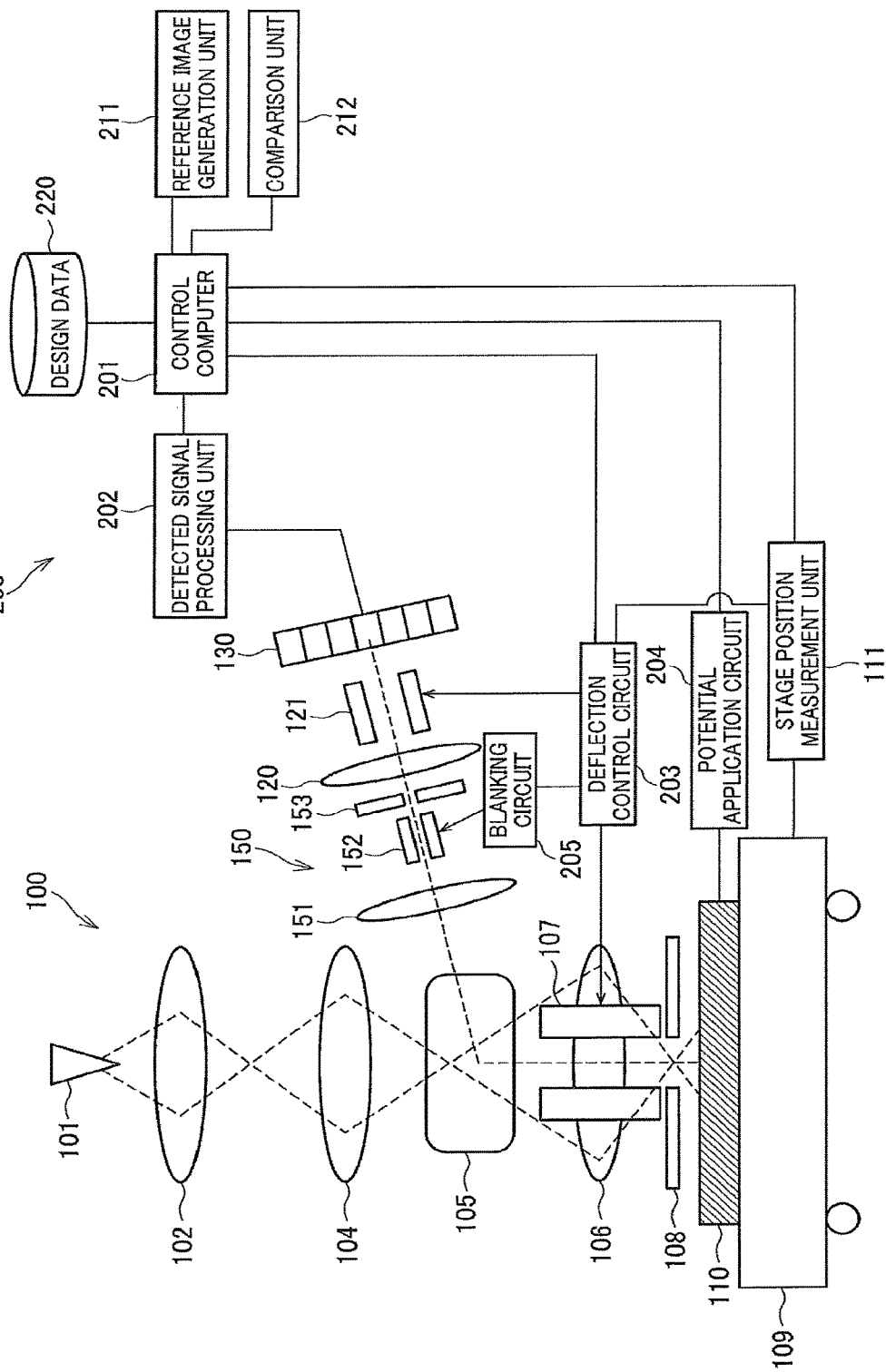
FIG. 18 is a schematic diagram illustrating an inspection apparatus according to another modification.

For example, a mechanism of inputting a high-speed pulse to a blanking electrode of transmission line type can be used as the blanking mechanism. FIG. 18 is a schematic view of an inspection apparatus including a blanking mechanism 150 and irradiating the substrate 110 with a single electron beam. The same components in FIG. 18 as those in FIG. 1 are denoted by the same reference signs, and description of those components is omitted.

In this inspection apparatus, the single electron beam is applied to the substrate 110. Secondary electrons (or reflection electrons) emitted from the substrate 110 are separated from the incident electron beam by the Wien filter 105, and are focused on any one of the detection elements 132 of the detector 130 through the blanking mechanism 150, the lens 120, the deflector 121, etc. The blanking mechanism 150 includes a lens 151, a blanking deflector 152, and a blanking aperture 153.

Corresponding to change of an irradiation target pixel on the substrate 110, the detection element 132 on which the secondary electrons (or the reflection electrons) are focused is switched over by controlling the distance of the deflection made by the deflector 121 in accordance with the signal from the deflection control circuit 203. In order to avoid the secondary electrons from reaching the detector 130, during a period in which an image of the secondary electrons traverses between the detection elements 132 in the detector 130, a control signal is output to the blanking deflector 152 from a blanking circuit 205, thus promptly deflecting the orbit of the secondary electrons to block off the secondary electrons by the blanking aperture 153. On that occasion, movement of the secondary electrons on the detector 130 can be reduced in the blanking operation by arranging a deflection center of the blanking deflection in a conjugate relation to the surface of the detector 130 with respect to a secondary electron focusing system.

Incident electrons may be blanked instead of the secondary electrons. In this case, the blanking aperture array is operative to blank all the beams. Alternatively, by providing a blanking deflector which deflects the whole beam upstream side of the Wien filter and providing a beam blanking aperture at a cross-over position downstream side of the blanking deflector, all the beams can be blanked. In this case, when the beam is blanked, the cross-over image is desirably moved while maintaining a movement of the beams on the sample surface small.

According to this inspection apparatus, a time during which one detection element 132 is irradiated with the secondary electron beam is short, but a sufficient time can be allocated to reading-out of the charges accumulated in the detection element 132. Let consider, for example, the case of using the detector 130 that includes a number 100 of detection elements (1, 1) to (10, 10), as illustrated in FIG. 19. FIG. 20 is a timing chart of processing executed in the individual detection elements. On an assumption that a cycle time from irradiation to one detection element until moving to the next detection element is denoted by τc and a reset time of the detection element before the start of the irradiation is τc, a time capable of being used by one detection element for the reading-out is 98 τc.

Thus, since a response speed of a circuit for reading out the charges accumulated in the detection element can be set to be slower, it is possible to perform the measurement with lower noise, and to realize higher sensitivity and an improvement of the throughput.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An inspection apparatus comprising:
an irradiation device irradiating an inspection target substrate with multiple beams including a plurality of energy beams;
a detector to which a plurality of charged particle beams formed by charged particles emitted from the inspection target substrate are applied, the detector detecting each of the charged particle beams as an electrical signal; and
a comparison processing circuitry performing pattern inspection by comparing image data of a pattern formed on the inspection target substrate, the pattern being reconstructed in accordance with the detected electrical signals, and reference image data,
wherein the detector includes a plurality of detection elements that accumulate charges attributable to the charged particle beams applied thereto, and a detection circuit that reads out the accumulated charges, the plurality of detection elements being grouped into a plurality of groups, and the detection circuit operates in a manner of, during a period in which the charged particle beams are applied to the detection elements included in one group, reading out the charges accumulated in the detection elements included in one or more other groups,
wherein the irradiation device includes an aperture mask including a plurality of holes arranged in a grid pattern and forming the multiple beams by allowing an energy beam emitted from a beam source to pass through the plurality of holes,
the plurality of detection elements are grouped into a first group and a second group, and
the detection elements of the first group and the second group are arranged along a first direction and are arranged alternately along a second direction perpendicular to the first direction.

2. The inspection apparatus according to claim 1, wherein the inspection target substrate is placed on a stage that is moved continuously,
the irradiation device deflects the multiple beams in a manner of moving a multi-beam irradiation position in match with movement of the stage and performing the beam irradiation at the same position for a predetermined time, and changes the beam irradiation position after the beam irradiation for the predetermined time, and
the group of the detection elements to which the charged particle beams are applied is switched over corresponding to the change of the beam irradiation position on the inspection target substrate.

3. The inspection apparatus according to claim 1, wherein, assuming that the number of the energy beams applied to the inspection target substrate is denoted by A and the number of groups of the grouped detection elements is denoted by B, the detector includes the detection elements in number of A×B or more.

4. The inspection apparatus according to claim 1, wherein the detector resets the accumulated charges after the reading-out of the charges from the detection element.

5. An inspection apparatus comprising:
an irradiation device irradiating an inspection target substrate with multiple beams including a plurality of energy beams;
a detector to which a plurality of charged particle beams formed by charged particles emitted from the inspection target substrate are applied, the detector detecting each of the charged particle beams as an electrical signal; and
a comparison processing circuitry performing pattern inspection by comparing image data of a pattern formed on the inspection target substrate, the pattern being reconstructed in accordance with the detected electrical signals, and reference image data,
wherein the detector includes a plurality of detection elements that accumulate charges attributable to the charged particle beams applied thereto, and a detection circuit that reads out the accumulated charges, the plurality of detection elements being grouped into a plurality of groups, and the detection circuit operates in a manner of, during a period in which the charged particle beams are applied to the detection elements included in one group, reading out the charges accumulated in the detection elements included in one or more other groups,
wherein the irradiation device includes an aperture mask including a plurality of holes arranged in a zigzag pattern and forming the multiple beams by allowing an energy beam emitted from a beam source to pass through the plurality of holes,
the plurality of detection elements are grouped into a first group and a second group, and
the detection elements of the first group and the second group are arranged alternately along each of a first direction and a second direction perpendicular to the first direction.

6. An inspection apparatus comprising:
an irradiation device irradiating an inspection target substrate with a single energy beam;
a detector to which a charged particle beam formed by charged particles emitted from the inspection target substrate is applied, the detector detecting the charged particle beam as an electrical signal; and
a comparison processing circuitry performing pattern inspection by comparing image data of a pattern formed on the inspection target substrate, the pattern being reconstructed in accordance with the detected electrical signals, and reference image data,
wherein the detector includes a plurality of detection elements that accumulate charges attributable to the charged particle beams applied thereto, and a detection circuit that reads out the accumulated charges, and the detection circuit operates in a manner of, during a period in which the charged particle beam is applied to one of the detection elements, reading out the charges accumulated in one or more other detection elements, the detection element to which the charged particle beam is applied is switched over corresponding to change of a beam irradiation position on the inspection target substrate, and the inspection apparatus further comprising a blanking mechanism that blocks off the charged particle beam and prevents the charged particle beam from reaching the detector during a period of the switching-over of the detection element to which the charged particle beam is applied.

7. The inspection apparatus according to claim 6, wherein the detector resets the accumulated charges after the reading-out of the charges from the detection element.

\* \* \* \* \*